United States Patent
Chakravarty

(10) Patent No.: US 8,499,230 B2
(45) Date of Patent: Jul. 30, 2013

(54) CRITICAL PATH MONITOR FOR AN INTEGRATED CIRCUIT AND METHOD OF OPERATION THEREOF

(75) Inventor: Sreejit Chakravarty, Mountain View, CA (US)

(73) Assignee: LSI Corporation, Milpitas, CA (US)

( * ) Notice: Subject to any disclaimer, the term of this patent is extended or adjusted under 35 U.S.C. 154(b) by 1195 days.

(21) Appl. No.: 12/247,992

(22) Filed: Oct. 8, 2008

(65) Prior Publication Data
US 2009/0278576 A1    Nov. 12, 2009

Related U.S. Application Data

(60) Provisional application No. 61/126,881, filed on May 7, 2008.

(51) Int. Cl.
*G06F 11/00* (2006.01)
(52) U.S. Cl.
USPC ............ 714/798; 714/709; 714/731; 714/814
(58) Field of Classification Search
USPC .................................. 714/709, 731, 798, 814
See application file for complete search history.

(56) References Cited

U.S. PATENT DOCUMENTS

| | | | | |
|---|---|---|---|---|
| 5,471,159 A | * | 11/1995 | Stuebing et al. | 327/24 |
| 5,533,037 A | * | 7/1996 | Shah et al. | 714/815 |
| 6,526,109 B1 | * | 2/2003 | Chang et al. | 375/371 |
| 7,036,098 B2 | * | 4/2006 | Eleyan et al. | 714/30 |
| 7,834,642 B2 | * | 11/2010 | Hasegawa | 324/617 |
| 2002/0004926 A1 | * | 1/2002 | Erickson | 714/814 |
| 2006/0262934 A1 | * | 11/2006 | Hustig | 381/2 |
| 2007/0164787 A1 | * | 7/2007 | Grochowski et al. | 326/46 |

* cited by examiner

*Primary Examiner* — Joshua Lohn

(57) ABSTRACT

A path monitor, a method of monitoring a path, an integrated circuit and a library of standard logic elements. In one embodiment, the path monitor includes: (1) a delay element having an input couplable to an input of a clocked flip-flop associated with a path to be monitored and configured to provide a predetermined delay and (2) a clocked exclusive OR gate having a clock input, a first input coupled to an output of the delay element, a second input couplable to the output of the clocked flip-flop and an output at which the clocked exclusive OR gate is configured to respond to a clock signal to provide an error signal only when logic levels of the first input and the second input differ.

20 Claims, 4 Drawing Sheets

CRITICAL PATH MONITOR FOR AN INTEGRATED CIRCUIT AND METHOD OF OPERATION THEREOF

CROSS-REFERENCE TO PROVISIONAL APPLICATION

This application is related to U.S. Provisional Application Ser. No. 61/126,881, filed by Parker, et al., on May 7, 2008, entitled "A Novel Paradigm for Optimizing Performance, Power, Area and/or Yield in Integrated Circuits," commonly assigned with the invention and incorporated herein by reference.

TECHNICAL FIELD

The invention is directed, in general, to integrated circuits (ICs) and, more specifically, to a critical path monitor for an IC and a method of monitoring a path in an IC.

BACKGROUND

Conserving resources, including energy, has become a preeminent objective in today's world. Manufacturers of ICs are sensitive to the need to improve the energy efficiency of their products. National Semiconductor Corporation developed adaptive voltage scaling as part of that overall strategy. The idea behind adaptive voltage scaling was that an IC could be powered based on its actual electrical characteristics and current operating temperature, both of which in part determine signal propagation speed.

SUMMARY

One aspect of the invention provides a path monitor. In one embodiment, the path monitor includes: (1) a delay element having an input couplable to an input of a clocked flip-flop associated with a path to be monitored and configured to provide a predetermined delay and (2) a clocked exclusive OR (XOR) gate having a clock input, a first input coupled to an output of the delay element, a second input couplable to the output of the clocked flip-flop and an output at which the clocked XOR gate is configured to respond to a clock signal to provide an error signal only when logic levels of the first input and the second input differ.

Another aspect of the invention provides a method of monitoring a path. In one embodiment, the method includes: (1) providing a predetermined delay with a delay element having an input couplable to an input of a clocked flip-flop associated with a path to be monitored and (2) employing a clocked XOR gate having a clock input, a first input coupled to an output of the delay element and a second input couplable to the output of the clocked flip-flop to respond to a clock signal to provide an error signal at an output thereof only when logic levels of the first input and the second input differ.

Yet another aspect of the invention provides an IC. In one embodiment, the IC includes: (1) a substrate, (2) a plurality of paths located on the substrate, (3) a corresponding plurality of associated path monitors located on the substrate, each including: (3a) a delay element having an input couplable to an input of a clocked flip-flop associated with the corresponding path and configured to provide a predetermined delay and (3b) a clocked XOR gate having a clock input, a first input coupled to an output of the delay element, a second input couplable to the output of the clocked flip-flop and an output at which the clocked XOR gate is configured to respond to a clock signal to provide an error signal only when logic levels of the first input and the second input differ, (4) an unclocked (inclusive) OR gate located on the substrate and coupled to each the output of each the plurality of the path monitors and (5) a VMU located on the substrate and configured to receive an overall error signal from an output of the unclocked OR gate and control a voltage of the IC based thereon.

Still another aspect of the invention provides a library of standard logic elements. In one embodiment, the library includes a standard logic element corresponding to a path monitor, including: (1) a delay element having an input couplable to an input of a clocked flip-flop associated with a path to be monitored and configured to provide a predetermined delay and (2) a clocked XOR gate having a clock input, a first input coupled to an output of the delay element, a second input couplable to the output of the clocked flip-flop and an output at which the clocked XOR gate is configured to respond to a clock signal to provide an error signal only when logic levels of the first input and the second input differ.

The foregoing has outlined certain aspects and embodiments of the invention so that those skilled in the pertinent art may better understand the detailed description of the invention that follows. Additional aspects and embodiments will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION OF CERTAIN ASPECTS AND EMBODIMENTS

Adaptive voltage scaling and optimization (AVSO) represents a significant improvement over adaptive voltage scaling. AVSO not only allows an IC to be designed faster than conventionally thought possible, it allows the architecture of the IC to be chosen such that it can be powered at the lowest possible voltage without sacrificing performance.

ICs employing adaptive voltage scaling or AVSO employ path monitors (PMs) placed over their area to monitor transition propagation speed in nearby paths. PMs may therefore be regarded as speed monitors. PMs should be relatively small and simple circuits. While the IC is operating, the PMs determine whether or not the transition propagation speeds in nearby paths are slower or faster than expected and generate output voltages or digital values that reflect any speed difference. A voltage management unit (VMU) receives the voltages or values and controls voltage regulators associated with each voltage domain of the IC to increase or decrease supply voltages as needed.

ICs often employ PMs placed over their area to monitor transition propagation speed in nearby paths. Further, because the number of PMs employed in a given IC may be substantial, they should be relatively small and simple circuits. Since PMs require power to operate, they should also be relatively efficient. Described herein are various embodiments of PMs constructed according to the principles of the invention that are smaller and more efficient than conventional PMs. Also described herein are various embodiments of methods of monitoring a path, an IC employing plural PMs in the context of AVSO and a library of standard logic elements that includes a standard logic element corresponding to a PM constructed according to the principles of the invention.

Figure 1:
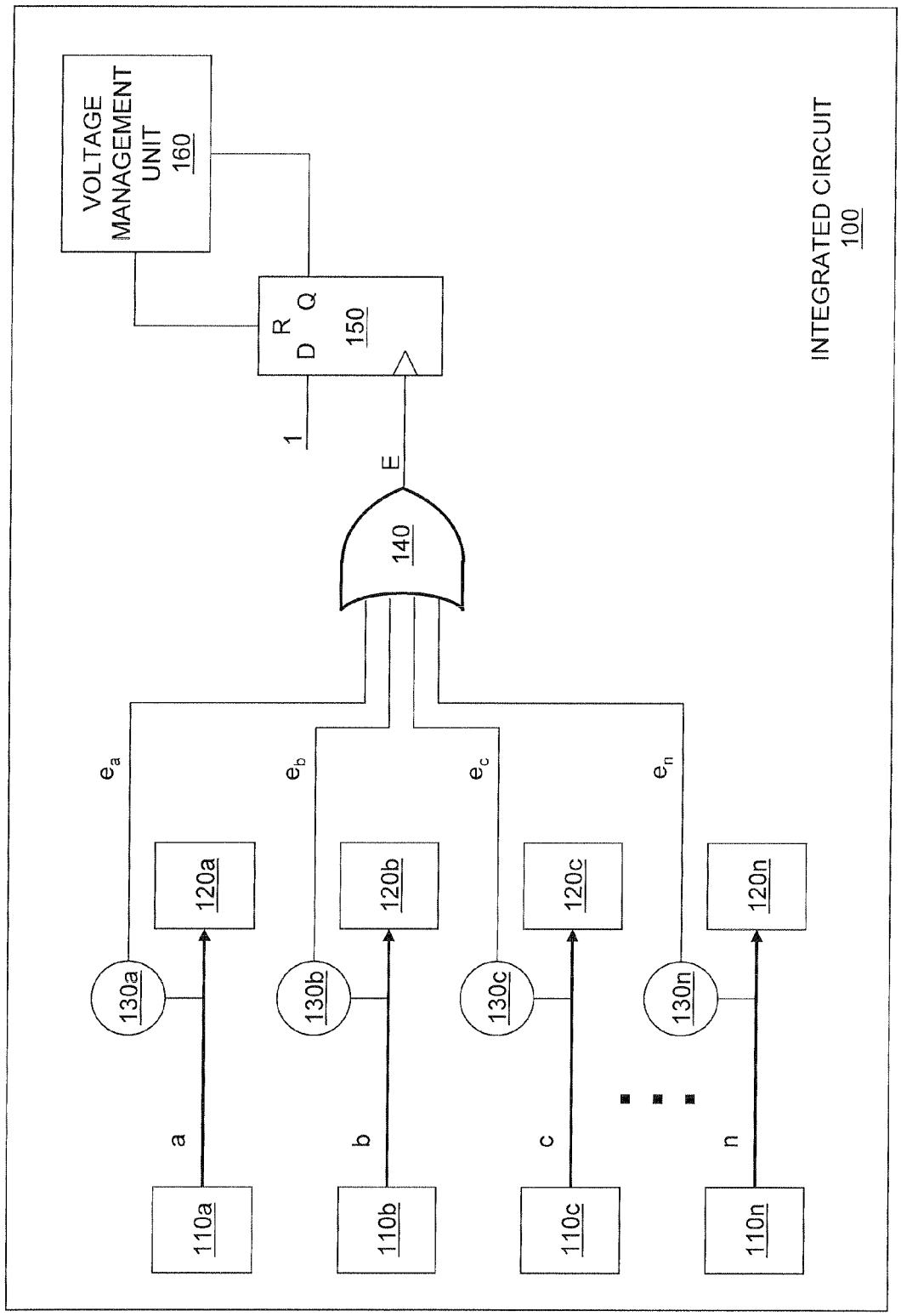
FIG. 1 is a block diagram of one embodiment of an IC within which a path monitor may be constructed or a method of monitoring a path may be carried out according to the principles of the invention.

FIG. 1 is a block diagram of one embodiment of an IC 100 within which a PM may be constructed or a method of monitoring a path may be carried out according to the principles of the invention. The IC 100 is formed on or in (those two terms being defined herein as equivalent) a substrate (indicated by an unreferenced box surrounding the IC 100).

A plurality of paths is located on the substrate. FIG. 1 shows four such paths: a path a beginning at a gate 110*a* and ending at a gate 120*a*, a path b beginning at a gate 110*b* and ending at a gate 120*b*, a path c beginning at a gate 110*c* and ending at a gate 120*c* and a path n beginning at a gate 110*n* and ending at a gate 120*n*. In the illustrated embodiment, the paths a, b, c, n are critical paths in a particular clock domain in the IC 100. However, in alternative embodiments, the paths a, b, c, n lie in different clock domains, the paths a, b, c, n are not critical paths, and the IC 100 does not have separate clock domains or monitored paths in all clock domains.

A corresponding plurality of associated PMs is also located on the substrate. In particular, a PM 130*a* is associated with the path a, a PM 130*b* is associated with the path b, a PM 130*c* is associated with the path c, and a PM 130*n* is associated with the path n. Each PM 130*a*, 130*b*, 130*c*, 130*n* provides a corresponding error signal $e_a$, $e_b$, $e_c$, $e_n$. An unclocked (inclusive) OR gate 140 is located on the substrate and coupled to each output of each the plurality of the PMs 130*a*, 130*b*, 130*c*, 130*n*. The unclocked OR gate 140 is configured to provide an overall error signal E when any one or more of the error signals $e_a$, $e_b$, $e_c$, $e_n$ is high. In the illustrated embodiment, E is an asynchronous signal.

A DQ flip-flop 150 is located on the substrate and is configured to receive a logical one into a D input thereof and the overall error signal E into a clock input thereof. A VMU 160 is located on the substrate and is configured to receive the overall error signal E via the DQ flip-flop 150. More specifically, when the overall error signal E transitions high (to a logical one), the DC flip-flop 150 transfers the logical one present at its D input to its Q output, providing the logical one to the VMU 160. The VMU 160 is configured to control one or more supply voltages associated with the one or more clock domains in the IC 100 based on the overall error signal E. The VMU 160 is also configured to reset the overall error signal E by providing a reset signal to the R input of the DQ flip-flop 150.

In the illustrated embodiment, the VMU 160 is configured to operate at startup or during operation of the IC 100. When power is first applied to the IC 100, the VMU 160 initially sets the supply voltage of the particular clock domain containing the paths a, b, c, n to a minimum level. If the VMU 160 then receives the overall error signal E, the VMU 160 responds by incrementally increasing the supply voltage and resetting the overall error signal E. This initialization process is repeated until the VMU 160 no longer receives the overall error signal E. The VMU 160 to configured to respond in a like manner should the overall error signal E become high during subsequent operation of the IC 100 (due for example to changes in operating temperature or aging); the VMU 160 incrementally increases supply voltage to the particular clock domain until the overall error signal E is no longer high.

The VMU 160 is also configured to operate such that supply voltage is adjusted dynamically during the operation of the IC 100. If one or more temperature sensors (not shown) in the IC 100 indicate that the IC 100 is operating at a higher-than-desired temperature, resulting path delays are likely to decrease, increasing the overall power consumption of the IC 100. To counter this, the VMU 160 undertakes to decrease overall power consumption by decreasing the supply voltage. Any resulting overall error signal E instructs the VMU 160 that the supply voltage needs to be increased. As the operating temperature of the IC 100 decreases, the VMU 160 can undertake to decrease the supply voltage and monitor the overall error signal E to ensure that the supply voltage is not insufficient. Alternative embodiments of the VMU 160 perform only one or some of these functions, perhaps with other functions not described herein.

In the illustrated embodiment, the various PMs 130*a*, 130*b*, 130*c*, 130*n* are configured such that they provide their respective error signals $e_a$, $e_b$, $e_c$, $e_n$ only when transition propagation speeds in their associated critical paths a, b, c, n are less than a predetermined minimum speed below which the IC 100 may not operate properly. Thus, the process by which the VMU 160 incrementally increases supply voltage until the overall error signal E is no longer high results in a supply voltage for the particular clock domain being set at a minimal functional level.

In the illustrated embodiment, the VMU 160 monitors and controls supply voltages of multiple clock domains in the IC in like manner. Therefore, the overall power consumption of the IC 100 is probably substantially less than were the supply voltages not to be so controlled.

One conventional PM is designed to work in conjunction with a clocked flip-flop located at the end of path that is to be monitored (the "path flip-flop"). The PM includes a clocked flip-flop (a "replica flip-flop") that is identical to the path flip-flop and driven by the same clock. A delay element is coupled to the input of the path flip-flop to receive transitions provided to the path flip-flop. The delay element delays received transitions by a predetermined amount of time delay D, then provides them to the replica flip-flop. The clock drives the path flip-flop and the replica flip-flop in unison. As long as the transition propagation speed in the path is adequate, the outputs of the path and replica flip-flops are identical. If the transition propagation speed falls below a certain level, in other words, if the transition fails to arrive D time units before the end of a clock period, the outputs of the path and replica flip-flops differ. An unclocked XOR gate is coupled to the outputs of the path and replica flip-flops delay that produces a high output representing an error only when the two outputs differ.

In general, a PM should impact the performance of the IC 100 as little as possible. It should minimally load the path that it is monitoring. It should occupy relatively little area. Its power consumption should be low. It should be fast enough to provide accurate monitoring. Finally, it should resist aging. While the conventional PM works as intended, its replica flip-flop contains 26 transistors, and its XOR gate contains 12 transistors, for a total of 38 transistors. Given the desired attributes of a PM as outlined above, a PM having fewer transistors would be distinctly advantageous.

Figure 2:
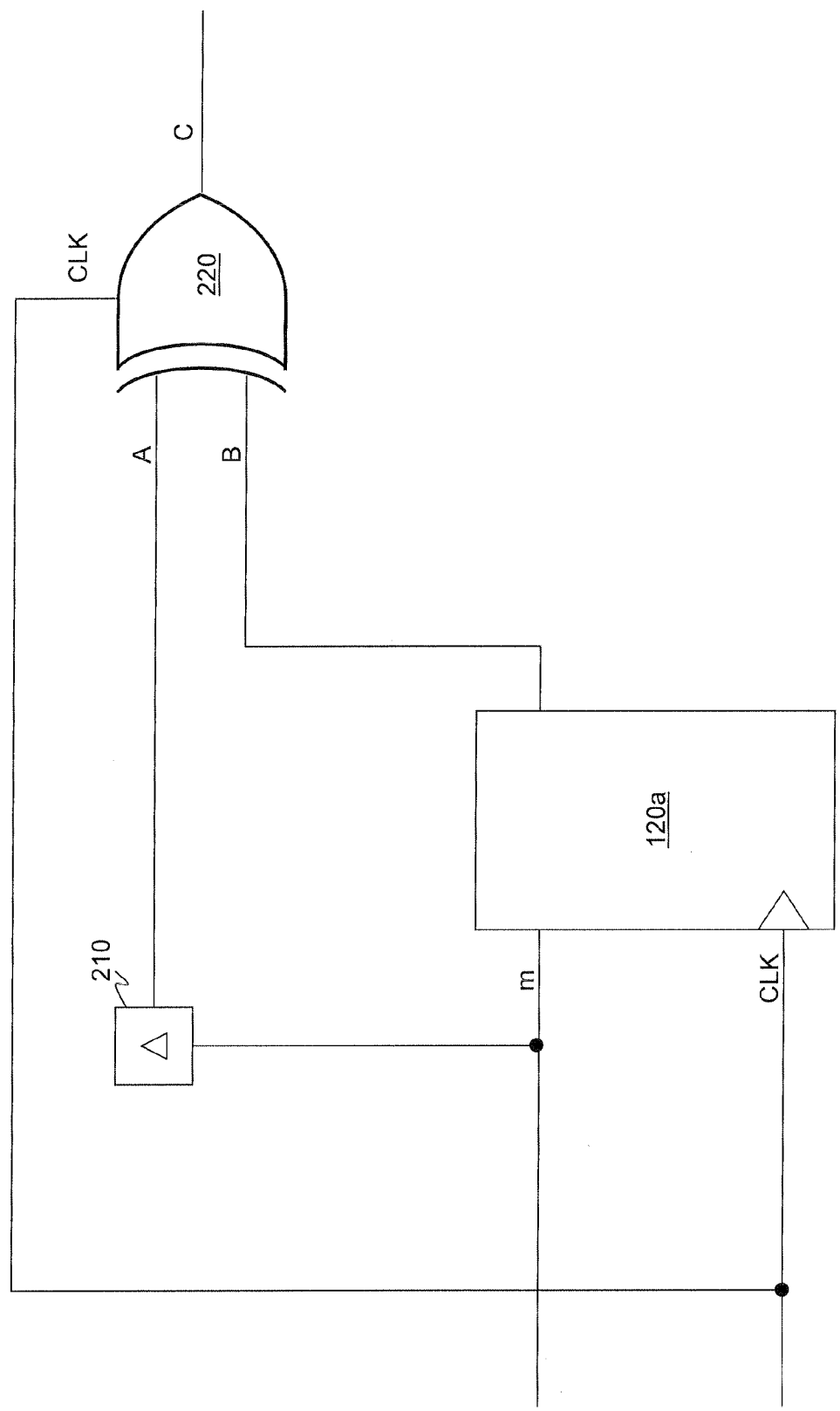
FIG. 2 is a logic-level schematic diagram of one embodiment of a path monitor constructed according to the principles of the invention.

Various embodiments of a novel PM having about 63% fewer transistors will now be described. FIG. 2 is a logic-level schematic diagram of one embodiment of a PM constructed according to the principles of the invention. The PM includes a delay element 210. The delay element 210 has an input couplable to an input of a clocked flip-flop 120a associated with a path to be monitored. In FIG. 2, the delay element 210 is coupled to the path to monitor a signal m. The delay element 210 is configured to provide a predetermined delay D to the signal m. The PM further includes a clocked XOR gate 220. The clocked XOR gate 220 has a clock input CLK, a first input A, a second input B and an output C. The first input A is coupled to an output of the delay element 210 such that it receives the signal m after the delay D. The second input B is coupled to the output of the clocked flip-flop 120a such that it receives the output of the clocked flip-flop 120a after the clocked flip-flop 120a has been triggered. The clock input is coupled to the same clock line that drives the clocked flip-flop 120a. The output C of the clocked XOR gate 220 is configured to respond to a clock signal received from the clock line via its CLK input by providing an error signal (a high logic level in the illustrated embodiment) only when logic levels of the first input A and the second input B differ (assume different logic levels). A difference indicates that the signal propagation speed is either too slow, which produces setup violations, or too fast, which produces hold violations.

Figure 3:
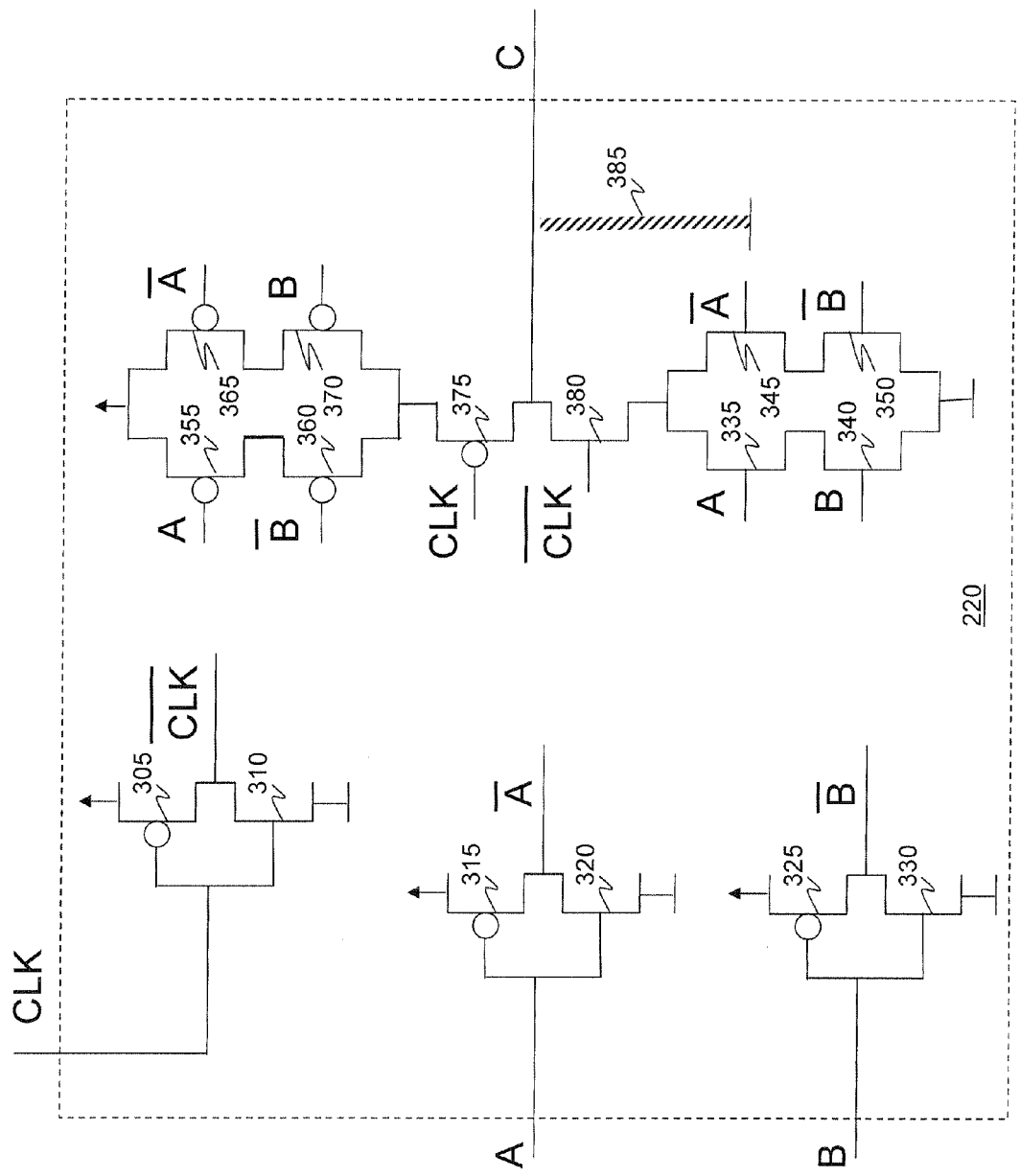
FIG. 3 is a device-level schematic diagram of one embodiment of a clocked XOR gate that may be located in the path monitor of FIG. 2.

Turning now to FIG. 3, the clocked XOR gate will now be described at a device level. The first input A is provided to a junction between a p-type metal-oxide semiconductor field-effect transistor (MOSFET) 305 and an n-type MOSFET 310 spanning positive and ground rails of a supply voltage (e.g., $V_{dd}$ and $V_{ss}$) to yield a signal $\overline{A}$, where $\overline{A}$ is inverted with respect to A. The second input B is provided to a junction between a p-type MOSFET 315 and an n-type MOSFET 320 spanning the rails of the supply voltage to yield a signal $\overline{B}$, $\overline{B}$ being inverted with respect to B. The clock input CLK is provided to a junction between a p-type MOSFET 325 and an n-type MOSFET 330 spanning the rails of the supply voltage to yield a signal $\overline{CLK}$, $\overline{CLK}$ being inverted with respect to CLK. The remaining portion of the clocked XOR gate takes the form of a ladder of MOSFETs spanning the positive and ground rails of the supply voltage, as shown. A, $\overline{A}$, B and $\overline{B}$ are provided to gates of p-type and n-type MOSFETs 335, 340, 345, 350, 355, 360, 365, 370, as shown. CLK and $\overline{CLK}$ are respectively provided to gates of a p-type MOSFET 375 and an n-type MOSFET 380, as shown. A MOSFET 385 provides a weak pulldown to the output C as shown.

The clocked XOR gate of FIG. 3 operates as follows. When CLK is high, $\overline{CLK}$ is low, and the MOSFETs 375, 380 are open. The output C is isolated from the first and second inputs A, B. Consequently, the MOSFET 385 weakly pulls the output C down. When CLK is low, $\overline{CLK}$ is high, and the MOSFETs 375, 380 are closed. The output C then depends upon the relative logic levels of the inputs A, B. If A=B=0, the MOSFETs 335, 340, 355, 370 are open, and the MOSFETs 345, 350, 360, 365 are closed. As a result, the output C is coupled to the ground rail through the MOSFETS 380, 345, 350, resulting in the output C being low and no error signal $e_a$ being provided. If A=0 and B=1, the MOSFETs 335, 350, 365, 370 are open, and the MOSFETs 340, 345, 355, 360 are closed. As a result, the output C is coupled to the positive rail through the MOSFETS 375, 355, 360, overcoming the weak pulldown of the MOSFET 385, resulting in the output C being high and an error signal $e_a$ being provided. If A=1 and B=0, the MOSFETs 340, 345, 355, 360 are open, and the MOSFETs 335, 350, 365, 370 are closed. As a result, the output C is coupled to the positive rail through the MOSFETS 375, 365, 370, overcoming the weak pulldown of the MOSFET 385, resulting in the output C being high and an error signal $e_a$ being provided. If A=B=1, the MOSFETs 345, 350, 360, 365 are open, and the MOSFETs 335, 340, 355, 370 are closed. As a result, the output C is coupled to the ground rail through the MOSFETS 380, 335, 340, resulting in the output C being low and no error signal $e_a$ being provided.

Compared to the unclocked XOR gate of the conventional PM described above, the clocked XOR gate of FIG. 3 requires only nine additional transistors (MOSFETs 305, 310, 315, 320, 325, 330, 375, 380, 385). However, the 26 transistors present in the replica flip-flop of the conventional PM have been eliminated. The overall transistor count has been reduced from 38 to 17 (about 63%) with no decrease in performance.

To increase the speed at which the novel PM may be employed in new IC designs, the PM may be incorporated into a library of standard logic elements that may be employed to design ICs and masks for fabrication of ICs that contain many, perhaps thousands or even millions of PMs constructed according to the principles of the invention. The ICs may as a result exhibit a substantially reduced power consumption afforded not only by the fact that the PMs employ fewer transistors but also by the superior supply voltage management that results from using the PMs.

Figure 4:
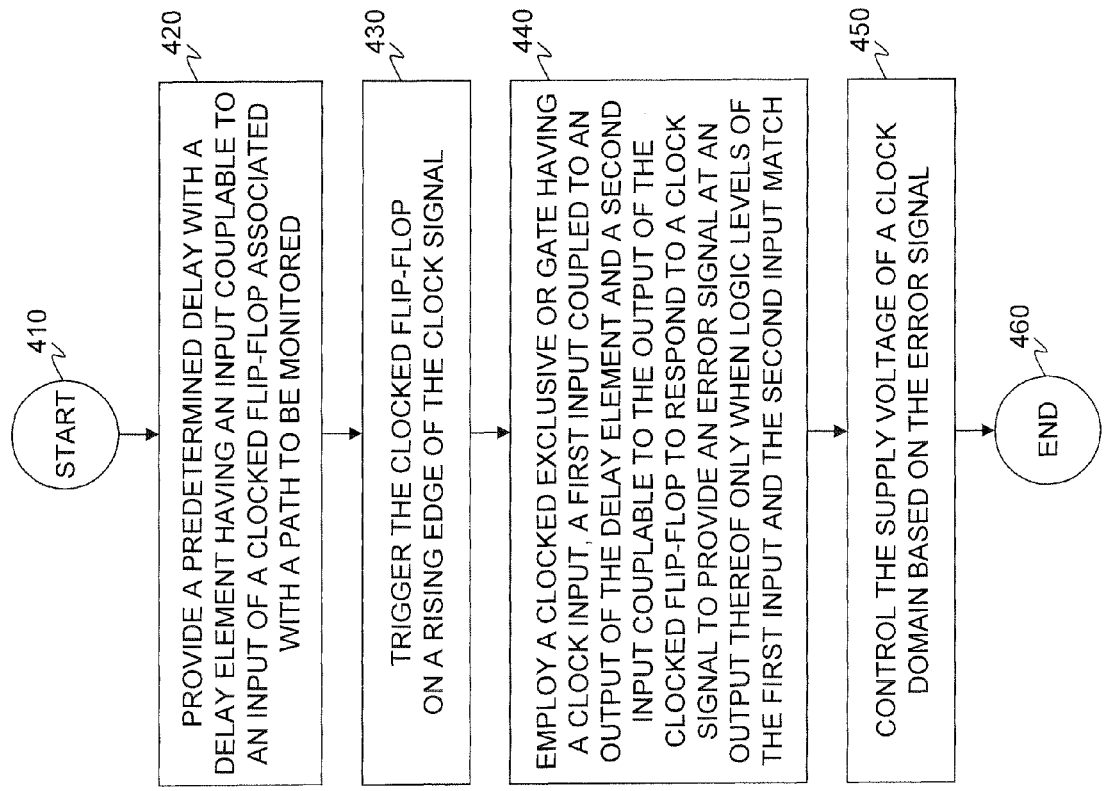
FIG. 4 is a flow diagram of one embodiment of a method of monitoring a path carried out according to the principles of the invention.

FIG. 4 is a flow diagram of one embodiment of a method of monitoring a path carried out according to the principles of the invention. The method begins in a start step 410. In a step 420, a predetermined delay is provided with a delay element having an input couplable to an input of a clocked flip-flop associated with a path to be monitored. In a step 430, the clocked flip-flop may be triggered on a rising edge of the clock signal. In a step 440, a clocked XOR gate having a clock input, a first input coupled to an output of the delay element and a second input couplable to the output of the clocked flip-flop is employed to respond to a clock signal to provide an error signal at an output thereof only when logic levels of the first input and the second input differ. The clocked XOR gate may provide the error signal when the clock signal is low. In a step 450, the supply voltage of a clock domain is controlled based on the error signal, perhaps in combination with other error signals. The method ends in an end step 460.

Although the various embodiments of the PM disclosed herein have been described in the context of monitoring signal propagation speed for the purpose of power management and increasing energy efficiency, PMs can also be used for speed-binning, frequency control, monitoring of circuit aging and other conventional purposes known to those skilled in the pertinent art or later-developed purposes.

Those skilled in the art to which the invention relates will appreciate that other and further additions, deletions, substitutions and modifications may be made to the described embodiments without departing from the scope of the invention.

What is claimed is:

1. A path monitor, comprising:
   a delay element having an input couplable to an input of a clocked flip-flop associated with a path to be monitored and configured to provide a predetermined delay; and
   a clocked exclusive OR gate having a clock input, a first input coupled to an output of said delay element, a second input couplable to said output of said clocked flip-flop and an output at which said clocked exclusive OR gate is configured to respond to a clock signal to provide an error signal only when logic levels of said first input and said second input differ, wherein said clock input, said first input and said second input are three distinctive inputs of said clocked exclusive OR gate.

2. The path monitor as recited in claim 1 wherein said exclusive OR gate is configured to provide said error signal when said clock signal is low.

3. The path monitor as recited in claim 1 wherein said predetermined delay is based on an identity of said path.

4. The path monitor as recited in claim 1 wherein said clocked flip-flop is triggered on a rising edge of said clock signal.

5. The path monitor as recited in claim 1 wherein said output is couplable to an unclocked OR gate associated with a voltage management unit.

6. The path monitor as recited in claim 1 wherein said clocked exclusive OR gate includes metal-oxide semiconductor field-effect transistors.

7. The path monitor as recited in claim 1 wherein said path and said path monitor are embodied on a common substrate as part of an integrated circuit.

8. A method of monitoring a path, comprising:
providing a predetermined delay with a delay element having an input couplable to an input of a clocked flip-flop associated with a path to be monitored; and
employing a clocked exclusive OR gate having a clock input, a first input coupled to an output of said delay element and a second input couplable to said output of said clocked flip-flop to respond to a clock signal to provide an error signal at an output thereof only when logic levels of said first input and said second input differ, wherein said clock input, said first input and said second input are three distinctive inputs of said clocked exclusive OR gate.

9. The method as recited in claim 8 wherein said employing comprises providing said error signal when said clock signal is low.

10. The method as recited in claim 8 wherein said predetermined delay is based on an identity of said path.

11. The method as recited in claim 8 further comprising triggering said clocked flip-flop on a rising edge of said clock signal.

12. The method as recited in claim 8 wherein said output is couplable to an unclocked OR gate associated with a voltage management unit.

13. The method as recited in claim 8 wherein said clocked exclusive OR gate includes metal-oxide semiconductor field-effect transistors.

14. The method as recited in claim 8 wherein said providing and said employing are carried out in an integrated circuit.

15. An integrated circuit, comprising:
a substrate;
a plurality of paths located on said substrate;
a corresponding plurality of associated path monitors located on said substrate, each including:
a delay element having an input couplable to an input of a clocked flip-flop associated with said corresponding path and configured to provide a predetermined delay, and
a clocked exclusive OR gate having a clock input, a first input coupled to an output of said delay element, a second input couplable to said output of said clocked flip-flop and an output at which said clocked exclusive OR gate is configured to respond to a clock signal to provide an error signal only when logic levels of said first input and said second input differ, wherein said clock input, said first input and said second input are three distinctive inputs of said clocked exclusive OR gate;
an unclocked OR gate located on said substrate and coupled to each said output of each said plurality of said path monitors; and
a voltage management unit located on said substrate and configured to receive an overall error signal from an output of said unclocked OR gate and control a voltage of said integrated circuit based thereon.

16. The integrated circuit as recited in claim 15 wherein said exclusive OR gate of each said plurality of said path monitors is configured to generate said error signal when said clock signal is low.

17. The integrated circuit as recited in claim 15 wherein said predetermined delay of each said plurality of said path monitors is based on an identity of said path.

18. The integrated circuit as recited in claim 15 wherein said clocked flip-flop in each said corresponding plurality of paths is triggered on a rising edge of said clock signal.

19. The integrated circuit as recited in claim 15 wherein said clocked exclusive OR gate of each said plurality of said path monitors includes metal-oxide semiconductor field-effect transistors.

20. A library of standard logic elements, comprising:
a standard logic element corresponding to a path monitor, including:
a delay element having an input couplable to an input of a clocked flip-flop associated with a path to be monitored and configured to provide a predetermined delay, and
a clocked exclusive OR gate having a clock input, a first input coupled to an output of said delay element, a second input couplable to said output of said clocked flip-flop and an output at which said clocked exclusive OR gate is configured to respond to a clock signal to provide an error signal only when logic levels of said first input and said second input differ, wherein said clock input, said first input and said second input are three distinctive inputs of said clocked exclusive OR gate.

* * * * *